US010113236B2

(12) United States Patent
Khan et al.

(10) Patent No.: US 10,113,236 B2
(45) Date of Patent: Oct. 30, 2018

(54) BATCH CURING CHAMBER WITH GAS DISTRIBUTION AND INDIVIDUAL PUMPING

(71) Applicant: Applied Materials, Inc., Santa Clara, CA (US)

(72) Inventors: Adib Khan, Santa Clara, CA (US); Shankar Venkataraman, San Jose, CA (US); Jay D. Pinson, II, San Jose, CA (US); Jang-Gyoo Yang, San Jose, CA (US); Nitin Krishnarao Ingle, San Jose, CA (US); Qiwei Liang, Fremont, CA (US)

(73) Assignee: APPLIED MATERIALS, INC., Santa Clara ( * ) Notice: Subject to any disclaimer, the term of this patent is extended or adjusted under 35 U.S.C. 154(b) by 794 days.

(21) Appl. No.: 14/577,828

(22) Filed: Dec. 19, 2014

(65) Prior Publication Data
US 2015/0329970 A1    Nov. 19, 2015

Related U.S. Application Data

(60) Provisional application No. 61/996,817, filed on May 14, 2014.

(51) Int. Cl.
*C23C 16/56* (2006.01)
*C23C 16/46* (2006.01)
(Continued)

(52) U.S. Cl.
CPC .............. *C23C 16/56* (2013.01); *C23C 16/44* (2013.01); *C23C 16/45565* (2013.01);
(Continued)

(58) Field of Classification Search
CPC ................................. H01L 21/67778
See application file for complete search history.

(56) References Cited

U.S. PATENT DOCUMENTS 5,879,459 A  *  3/1999  Gadgil ................... C23C 16/44
                                                    118/715
6,296,735 B1 * 10/2001  Marxer ................ C23C 14/566
                                                    118/719
(Continued)

FOREIGN PATENT DOCUMENTS

KR    2011-0033482 A    3/2011

OTHER PUBLICATIONS

PCT Notification of Transmittal of the International Search Report and the Written Opinion of the International Searching Authority for International Application No. PCT/US2015/026937 dated Jul. 31, 2015; 11 total pages.

*Primary Examiner* — Parviz Hassanzadeh
*Assistant Examiner* — Nathan K Ford
(74) *Attorney, Agent, or Firm* — Patterson + Sheridan LLP

(57) ABSTRACT

Embodiments of the present disclosure generally relate to a batch processing chamber that is adapted to simultaneously cure multiple substrates at one time. The batch processing chamber includes multiple processing sub-regions that are each independently temperature controlled. The batch processing chamber may include a first and a second sub-processing region that are each serviced by a substrate transport device external to the batch processing chamber. In addition, a slotted cover mounted on the loading opening of the batch curing chamber reduces the effect of ambient air entering the chamber during loading and unloading.

20 Claims, 11 Drawing Sheets

(51) Int. Cl.

| | |
|---|---|
| *C23C 16/455* | (2006.01) |
| *H01L 21/677* | (2006.01) |
| *H01L 21/02* | (2006.01) |
| *C23C 16/44* | (2006.01) |
| *H01L 21/67* | (2006.01) |
| *H01L 21/687* | (2006.01) |

(52) U.S. Cl.
CPC ........ *C23C 16/46* (2013.01); *H01L 21/02282* (2013.01); *H01L 21/6719* (2013.01); *H01L 21/67126* (2013.01); *H01L 21/67742* (2013.01); *H01L 21/67778* (2013.01); *H01L 21/68742* (2013.01); *H01L 21/68785* (2013.01)

(56) References Cited

U.S. PATENT DOCUMENTS

| | | |
|---|---|---|
| 2002/0033136 A1 | 3/2002 | Savage et al. |
| 2003/0173347 A1* | 9/2003 | Guiver .............. H01L 21/67017 219/390 |
| 2007/0084408 A1 | 4/2007 | Yudovsky et al. |
| 2007/0209593 A1* | 9/2007 | Aggarwal ............... C23C 16/54 118/724 |
| 2009/0016853 A1* | 1/2009 | Yoo .................. H01L 21/67201 414/147 |
| 2010/0173495 A1 | 7/2010 | Thakur et al. |
| 2012/0079982 A1 | 4/2012 | Lubomirsky et al. |

\* cited by examiner

BATCH CURING CHAMBER WITH GAS DISTRIBUTION AND INDIVIDUAL PUMPING

CROSS-REFERENCE TO RELATED APPLICATION(S)

The present application claims priority to U.S. Provisional Patent Application No. 61/996,817, entitled "Batch Curing Chamber with Gas Distribution and Individual Pumping", filed May 14, 2014, the entire contents of which are hereby incorporated herein by reference.

BACKGROUND

Field

Embodiments of the present disclosure generally relate to an apparatus and method for processing multiple substrates, such as semiconductor wafers, and more particularly, to an apparatus and method of curing a dielectric material disposed on multiple substrates.

Description of the Related Art

Semiconductor device geometries have dramatically decreased in size since their introduction several decades ago. Modern semiconductor fabrication equipment routinely produce devices with 32 nm, 28 nm and 22 nm feature sizes, and new equipment is being developed and implemented to make devices with even smaller geometries. The decreasing feature sizes result in structural features on a device having decreased spatial dimensions. Consequently, the widths of structures on the device (e.g., gaps, trenches and the like) can narrow to a point where the aspect ratio of gap depth to gap width becomes so high that filling such gaps with dielectric material is problematic. This is because the dielectric material being deposited is prone to a phenomenon known as "pinch-off," in which the entry region of a high aspect ratio gap or other structure may close before bottom-up fill has been completed, leaving voids or weak spots within the structure.

Over the years, many techniques have been developed to either avoid pinch-off or to "heal" voids or seams that have been formed as a result of pinch-off. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening process includes a heat treatment to remove volatile components from the deposited material that are necessary to make the initially deposited film flowable. After removal of these components, a hardened and dense dielectric material with high etch resistance, such as silicon oxide, is left behind.

The flowability of such films may result from various chemical components included in the films, but hardening and densifying the films through removal of these same chemical components is almost uniformly beneficial across the suite of flowable deposition techniques. These hardening and densifying processes can be time-consuming. Thus, there is a need for new post-processing techniques and apparatus for densifying the wide variety of flowable films that are currently available or are under development. This and other needs are addressed in the present disclosure.

SUMMARY

Embodiments of the present disclosure generally relate to an apparatus and method for processing substrates, such as semiconductor wafers, and more particularly, to an apparatus and method of batch curing a dielectric material disposed on multiple substrates.

Embodiments of the present disclosure may provide a system for forming a dielectric material on a surface of a substrate, the system comprising a mainframe, a factory interface that includes at least one atmospheric robot and is configured to receive one or more cassettes of substrates, a load lock chamber that is coupled to the mainframe and is configured to receive one or more substrates from the at least one atmospheric robot in the factory interface, multiple flowable CVD deposition chambers that are each coupled to the mainframe, and a batch processing chamber coupled to the factory interface, the batch processing chamber comprising multiple sub-processing regions that are each configured to receive a substrate from the at least one atmospheric robot and to perform a curing process on the substrate received from the atmospheric robot, a loading opening formed in a wall of the batch processing chamber, and a cover plate that includes multiple slotted openings and is disposed over the loading opening, wherein each of the multiple slotted openings are configured to allow the at least one atmospheric robot to extend an arm from a position outside of the batch processing chamber to one of the multiple sub-processing regions, and wherein each of the multiple slotted openings are configured to reduce the free area of the loading opening when the loading opening is open.

Embodiments of the present disclosure may further provide a batch substrate processing chamber, comprising multiple sub-processing regions that are each configured to receive a substrate from an atmospheric robot and to perform a curing process on the substrate received from the atmospheric robot, a loading opening formed in a wall of the batch processing chamber, and a cover plate disposed over the loading opening comprising multiple slotted openings, each of the slotted openings configured to allow at least one atmospheric robot to extend an arm from a position outside of the batch processing chamber to one of the multiple sub-processing regions, and wherein each of the multiple slotted openings are configured to reduce the free area of the loading opening when the loading opening is open.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a batch processing chamber that is adapted to simultaneously cure multiple substrates at one time. The chamber includes first and second sub-processing regions that are each serviced by a substrate transport device external to the batch processing chamber, and each sub-processing region may support a substrate. In one embodiment, a first sub-processing region is directly below a second sub-processing region, wherein the first and second sub-processing regions are accessible by the substrate transport device through a cover plate that covers a portion of a loading opening formed in the chamber.

Figure 1:
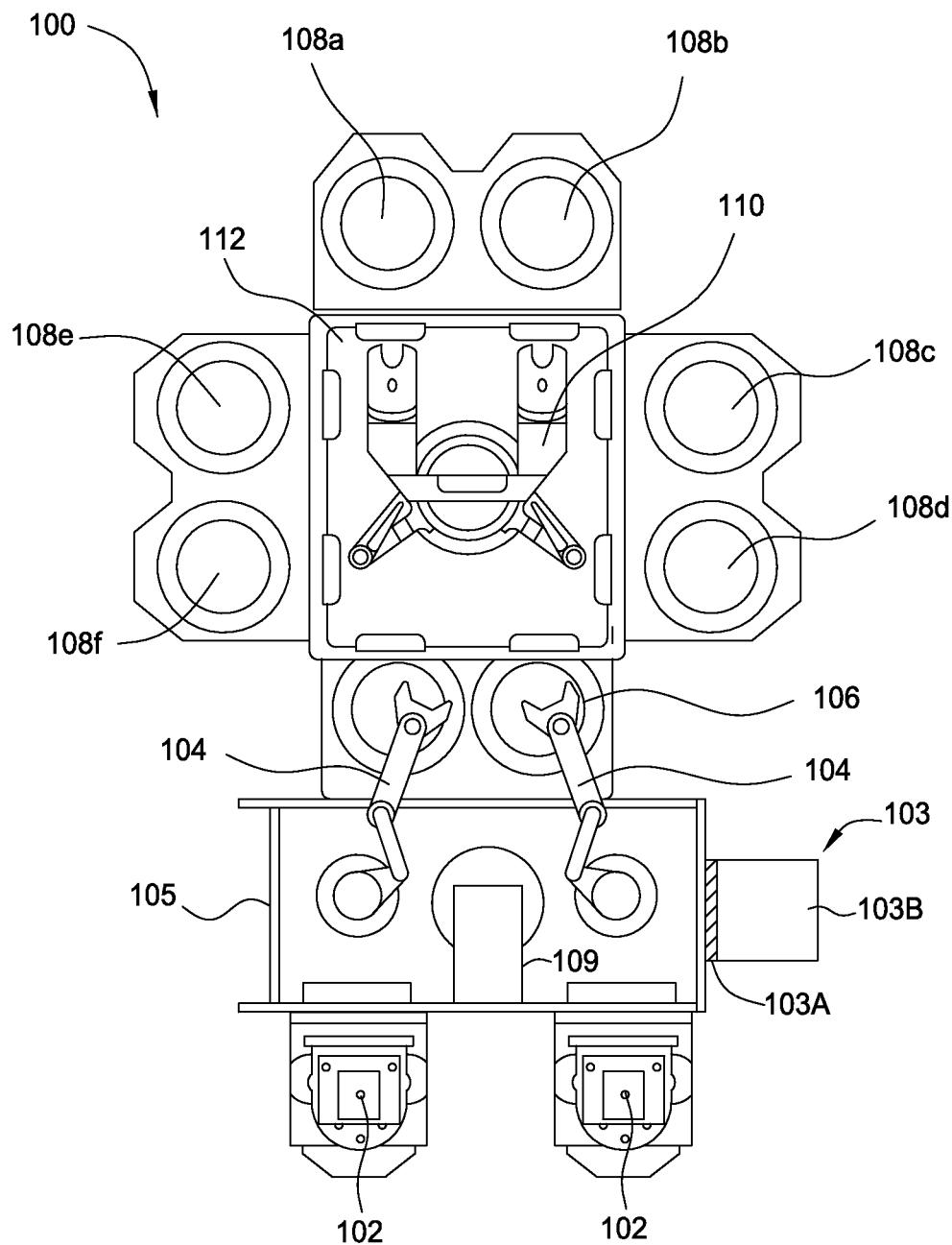
FIG. 1 is a top plan view of a processing tool, that includes a factory interface with a batch curing chamber configured according to an embodiment of the present disclosure.

FIG. 1 is a top plan view of one embodiment of a processing tool, that includes a factory interface 105 with a batch curing chamber 103 configured according to an embodiment of the present disclosure. The processing tool 100 generally includes the factory interface 105, the batch curing chamber 103, a transfer chamber 112, an atmospheric holding station 109, and a plurality of twin processing chambers 108a-b, 108c-d and 108e-f. In the processing tool 100, a pair of FOUPs (front opening unified pods) 102 supply substrates (e.g., 300 mm diameter wafers) that are received by the arms of an atmospheric robot 104 and placed into load lock chambers 106. A second robotic arm 110 is disposed in the transfer chamber 112 coupled to the load lock chambers 106. The second robotic arm 110 is used to transport the substrates from the load lock chambers 106 to processing chambers 108a-f coupled to the transfer chamber 112.

The processing chambers 108a-f may include one or more system components for depositing, annealing, curing and/or etching a flowable dielectric film on a substrate. In one configuration, three pairs of the processing chambers (e.g., 108a-b, 108c-d and 108e-f) may be used to deposit the flowable dielectric material on the substrate.

In some embodiments, the batch curing chamber 103 is configured to perform a batch curing process on multiple substrates simultaneously that have the flowable dielectric material deposited thereon. In such embodiments, the batch curing chamber 103 is generally configured to perform a curing process on the number of substrates that can simultaneously undergo film deposition in the twin processing chambers 108a-b, 108c-d and 108e-f. Thus, in the configuration illustrated in FIG. 1, the batch curing chamber 103 is advantageously sized to accommodate six substrates at one time during the curing process. Consequently, all substrates that have been processed by the twin processing chambers 108a-b, 108c-d and 108e-f can undergo the curing processing simultaneously, thereby maximizing substrate throughput of the processing tool 100.

Furthermore, in cases where multiple processing chambers have different processing recipe start and end times, to prevent substrates from remaining in the batch curing chamber 103 for significantly different amounts of time, the processing tool 100 may include the atmospheric holding station 109 that is used to hold the already processed substrates until the other subsequently processed substrates are finished with their deposition processing. The atmospheric holding station allows all of the substrates to be placed in the batch curing chamber 103 at once. For example, the atmospheric holding station 109 is configured to temporarily store substrates outside the batch curing chamber 103 until a desired number of substrates are available for processing in the batch curing chamber 103. The atmospheric robot 104 then loads the substrates into the batch curing chamber 103 in quick succession, so that no film-deposited substrate remains in the relatively high temperature batch curing chamber 103 for more than a few seconds longer than any other film-deposited substrate. Consequently, substrate-to-substrate variation in the curing process can be minimized or reduced.

The batch curing chamber 103 generally includes a chamber body 103B and slit valve 103A. The slit valve 103A is used to seal-off an internal region of the chamber body 103B after substrates have been positioned therein by the atmospheric robots 104. The batch curing process and the batch curing chamber 103 are further described with reference to FIGS. 4-10 below.

Flowable CVD Chamber and Deposition Process Examples

Figure 2:
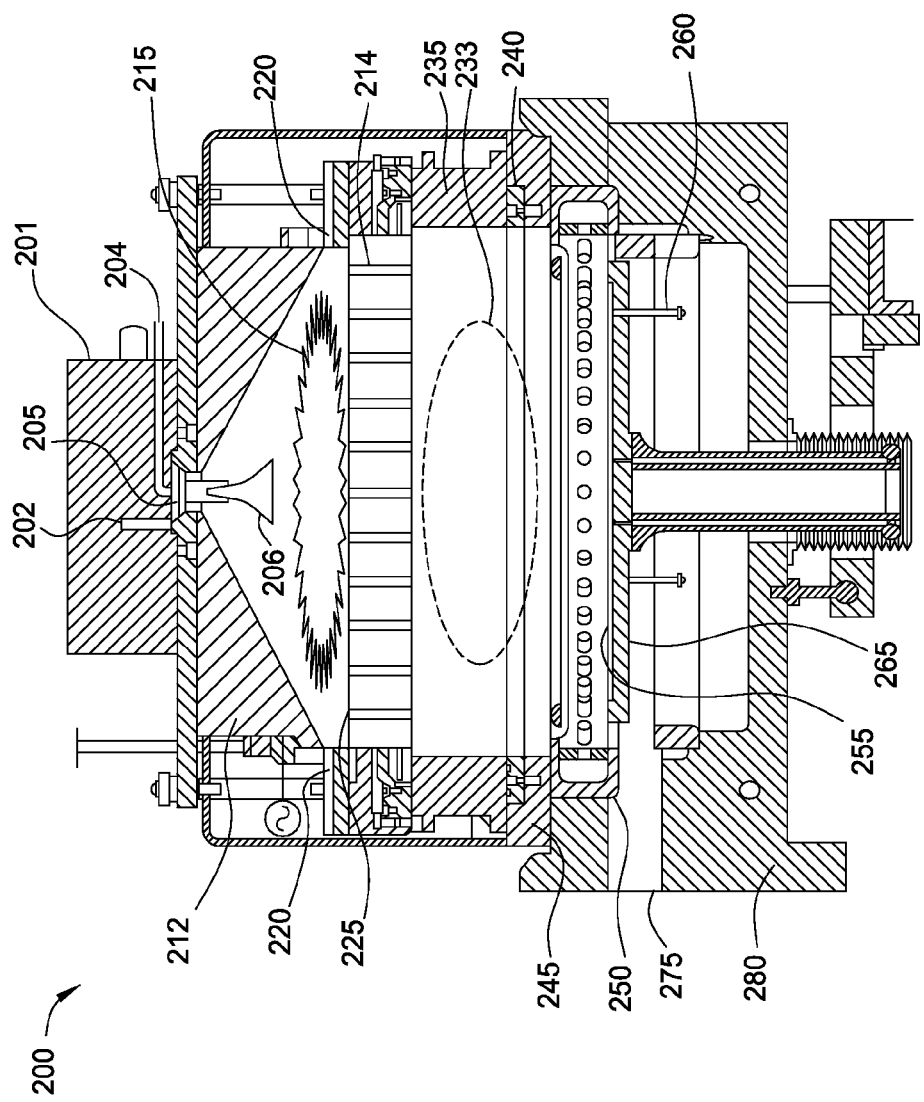
FIG. 2 is a cross-sectional view of one embodiment of a flowable chemical vapor deposition chamber with partitioned plasma generation regions.

FIG. 2 is a cross-sectional view of one embodiment of a flowable chemical vapor deposition chamber 200 with partitioned plasma generation regions. The process chamber 200 may be any of the processing chambers 108a-f of processing tool 100 that are configured at least for depositing a flowable dielectric material on a substrate. In some embodiments, rather than process chamber 200, processing tool 100 may include any other suitable chemical vapor deposition chamber.

During film deposition (e.g., silicon oxide, silicon nitride, silicon oxynitride or silicon oxycarbide deposition), a process gas may be flowed into a first plasma region 215 through a gas inlet assembly 205. The process gas may be excited prior to entering the first plasma region 215 within a remote plasma system (RPS) 201. The process chamber 200 includes a lid 212 and showerhead 225. The lid 212 is depicted with an applied AC voltage source and the showerhead 225 is grounded, consistent with plasma generation in the first plasma region 215. An insulating ring 220 is positioned between the lid 212 and the showerhead 225, enabling a capacitively coupled plasma (CCP) to be formed in the first plasma region 215. The lid 212 and showerhead 225 are shown with an insulating ring 220 therebetween, which allows an AC potential to be applied to the lid 212 relative to the showerhead 225.

The lid 212 may be a dual-source lid for use with a processing chamber. Two distinct gas supply channels are visible within the gas inlet assembly 205. A first channel 202 carries a gas that passes through the remote plasma system (RPS) 201, while a second channel 204 bypasses the RPS 201. The first channel 202 may be used for the process gas and the second channel 204 may be used for a treatment gas. The gases that flow into the first plasma region 215 may be dispersed by a baffle 206.

A fluid, such as a precursor, may be flowed into a second plasma region 233 of the process chamber 200 through the showerhead 225. Excited species derived from the precursor in the first plasma region 215 travel through apertures 214 in the showerhead 225 and react with the precursor flowing into the second plasma region 233 from the showerhead 225. Little or no plasma is present in the second plasma region 233. Excited derivatives of the precursor combine in the second plasma region 233 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed. A curing step (described below) may be used to further reduce or remove the organic content from the deposited dielectric material.

Exciting the precursor in the first plasma region 215 alone or in combination with the remote plasma system (RPS) 201 provides several benefits. The concentration of the excited species derived from the precursor may be increased within the second plasma region 233 due to the plasma in the first plasma region 215. This increase may result from the location of the plasma in the first plasma region 215. The second plasma region 233 is located closer to the first plasma region 215 than the remote plasma system (RPS) 201, leaving less time for the excited species to leave excited states through collisions with other gas molecules, walls of the chamber and surfaces of the showerhead.

The uniformity of the concentration of the excited species derived from the precursor may also be increased within the second plasma region 233. This may result from the shape of the first plasma region 215, which is more similar to the shape of the second plasma region 233. Excited species created in the remote plasma system (RPS) 201 travel greater distances in order to pass through apertures 214 near the edges of the showerhead 225 relative to species that pass through apertures 214 near the center of the showerhead 225. The greater distance results in a reduced excitation of the excited species and, for example, may result in a slower growth rate near the edge of a substrate. Exciting the precursor in the first plasma region 215 mitigates this variation.

In addition to the precursors, there may be other gases introduced at varied times for varied purposes. A treatment gas may be introduced to remove unwanted species from the chamber walls, the substrate, the deposited film and/or the film during deposition. The treatment gas may comprise at least one of the gases from the group comprising of $H_2$, an $H_2/N_2$ mixture, $NH_3$, $NH_4OH$, $O_3$, $O_2$, $H_2O_2$ and water vapor. A treatment gas may be excited in a plasma and then used to reduce or remove a residual organic content from the deposited film. In other embodiments, the treatment gas may be used without a plasma. When the treatment gas includes water vapor, the delivery may be achieved using a mass flow meter (MFM) and injection valve or by other suitable water vapor generators.

In one embodiment, the dielectric layer can be deposited by introducing dielectric material precursors, e.g., a silicon containing precursor, and reacting processing precursors in the second plasma region 233. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include $Si_xN_yH_z$-containing precursors, such as sillyl-amine and its derivatives including trisillylamine (TSA) and disillylamine (DSA), $Si_xN_yH_zO_{zz}$-containing precursors, $Si_xN_yH_zCl_{zz}$-containing precursors, or combinations thereof.

Processing precursors include hydrogen-containing compounds, oxygen-containing compounds, nitrogen-containing compounds, or combinations thereof. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 215 to produce process gas plasma and radicals including N* and/or H* and/or O* containing radicals or plasma, for example, $NH_3$, $NH_2$*, NH*, N*, H*, O*, N*O*, or combinations thereof. Alternatively, the processing precursors may already be in a plasma state after passing through a remote plasma system prior to introduction to the first plasma region 215.

The excited processing precursor 290 is then delivered to the second plasma region 233 for reaction with the precursors though apertures 214. Once in the processing volume, the processing precursor may mix and react to deposit the dielectric materials.

In one embodiment, the flowable CVD process performed in the process chamber 200 may deposit the dielectric materials as a polysilazanes based silicon containing film (PSZ-like film), which may be reflowable and fillable within trenches, features, vias, or other apertures defined in a substrate where the polysilazanes based silicon containing film is deposited.

In addition to the dielectric material precursors and processing precursors, there may be other gases introduced at varied times for varied purposes. A treatment gas may be introduced to remove unwanted species from the chamber walls, the substrate, the deposited film and/or the film during deposition, such as hydrogen, carbon, and fluorine. A processing precursor and/or treatment gas may comprise at least one of the gases from the group comprising $H_2$, a $H_2/N_2$ mixture, $NH_3$, $NH_4OH$, $O_3$, $O_2$, $H_2O_2$, $N_2$, $N_2H_4$ vapor, NO, $N_2O$, $NO_2$, water vapor, or combinations thereof. A treatment gas may be excited in a plasma and then used to reduce or remove a residual organic content from the deposited film. In other embodiments the treatment gas may be used without a plasma. The treatment gas may be introduced from into the first processing region, either through the RPS unit or bypassing the RPS unit, and may further be excited in the first plasma region.

Silicon nitrides materials include silicon nitride, $Si_xN_y$, hydrogen-containing silicon nitrides, $Si_xN_yH_z$, silicon oxynitrides, including hydrogen-containing silicon oxynitrides, $Si_xN_yH_zO_{zz}$, and halogen-containing silicon nitrides, including chlorinated silicon nitrides, $Si_xN_yH_zCl_{zz}$. The deposited dielectric material may then be converted to a silicon oxide like material.

Deposition and Batch Cure Processing Sequence Example

Figure 3:
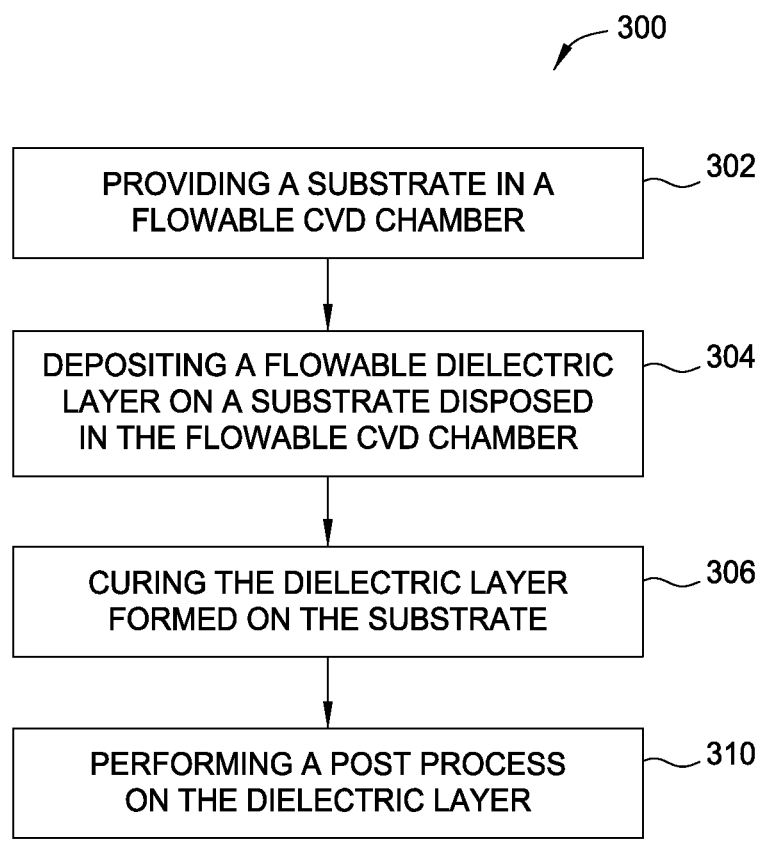
FIG. 3 is a flow diagram of one embodiment of a process that may be practiced in the process chamber 200 and batch curing chamber 103 illustrated in FIG. 1.
Figure 4A:
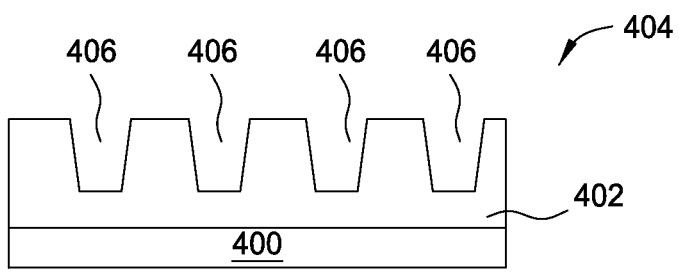
FIGS. 4A-4C are schematic cross-sectional views of a portion of a substrate corresponding to various stages of the process illustrated in FIG. 3.
Figure 4B:
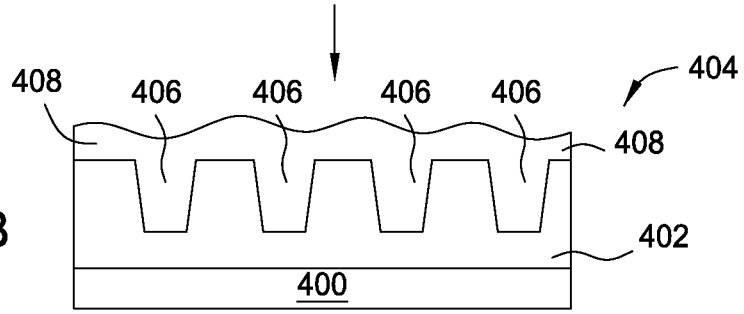
Figure 4C:
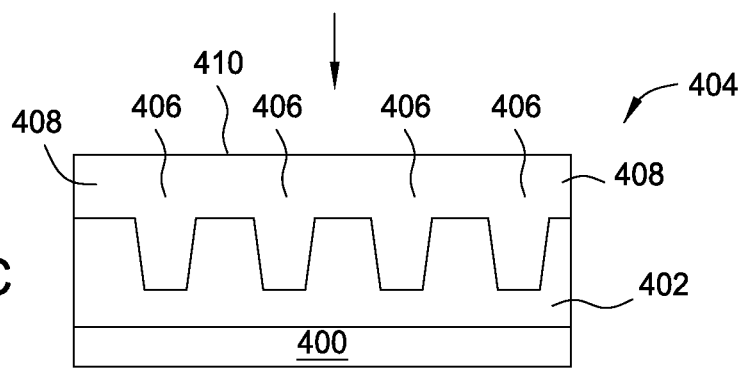

FIG. 3 is a flow diagram of one embodiment of a process 300 that may be practiced in a process chamber 200 and batch curing chamber 103. FIGS. 4A-4C are schematic cross-sectional views of a portion of a substrate corresponding to various stages of the process 300. Although the process 300 is illustrated for forming a dielectric material in trenches defined in or on a substrate, such as a shallow trench isolation (STI) structure manufacture process, the process 300 may be utilized to form other structures, such as interlayer dielectric (ILD) structures, on a substrate.

The process 300 begins at step 302 by transferring a substrate 400, as depicted in FIG. 4A, to a deposition process chamber, such as the flowable chemical vapor deposition (CVD) chamber 200 depicted in FIG. 2. In one embodiment, the substrate 400 may be a silicon substrate having a layer or layers formed thereon utilized to form a structure, such as a shallow trench isolation (STI) structure 404. In another embodiment, the substrate 400 may be a silicon substrate having multiple layers, e.g., a film stack, utilized to form different patterns and/or features. The substrate 400 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate 400 may be any of various shapes and dimensions, such as 200 mm, 300 mm or 450 mm diameter wafers, or rectangular or square panels.

In the embodiment illustrated in FIG. 4A, a layer 402 is disposed on the substrate 400 and is suitable for the fabrication of an STI structure 404 via deposition of a flowable dielectric material. In some embodiments, the layer 402 may be etched or patterned to form trenches 406 within the layer 402 for forming a shallow trench isolation (STI) structure, which may be used for electrically isolating devices in an integrated circuit from one another. Alternatively, in embodiments in which the layer 402 is not present, processes described herein as performed on the layer 402 may be performed on the substrate 400.

At step 304, a dielectric material 408 is deposited on the substrate 400 filling the trenches 406 defined within the layer 402, as shown in FIGS. 4B. The dielectric material 408 may be deposited by the flowable chemical vapor deposition process performed in the process chamber 200, as described above with referenced to FIG. 2. In one embodiment, the dielectric material 408 is a silicon-containing material deposited by the gas mixture supplied into the process chamber 200.

In one embodiment, the gas mixture supplied into the process chamber 200 for forming the dielectric material 408 may include a dielectric material precursor and a processing precursor, as discussed above. In addition, suitable examples of the processing precursors may include a nitrogen containing precursor, as discussed above. Furthermore, the processing precursors may also include hydrogen-containing compounds, oxygen-containing compounds or combinations thereof, wuch as $NH_3$ gas. The processing precursor may alternatively include one or more of the precursors as needed.

In one embodiment, the substrate temperature during the deposition process is maintained within a predetermined temperature range. In one embodiment, the substrate temperature is maintained at less than about 200 degrees Celsius, such as less than 100 degrees Celsius so as to allow the dielectric material 408 formed on the substrate to be flowable to reflow and fill within the trenches 406. It is believed that relatively low substrate temperature, such as less than 100 degrees Celsius, can assist in maintaining the film initially formed on the substrate surface in a liquid-like flowable state, so as to preserve the flowability and viscosity of the resultant film formed thereon. As the resultant film is formed on the substrate having a certain degree of flowability and viscosity, the bonding structure of the film may be transformed, converted, replaced with or into different function groups or bonding structure after the subsequent thermal and wet processes. In one embodiment, the substrate temperature in the process chamber is maintained at a range between about room temperature to about 200 degrees Celsius, such as about less than 100 degrees Celsius, for example between about 30 degrees Celsius and about 80 degrees Celsius.

The dielectric material precursor may be supplied into the processing chamber at a flow rate between about 1 sccm and about 5000 sccm. The processing precursors may be supplied into the processing chamber at a flow rate between about 1 sccm and about 1000 sccm. Alternatively, the gas mixture supplied during processing may also be controlled at a flow ratio of dielectric material precursor to processing precursor of between about 0.1 and about 100. The process pressure is maintained at between about 0.10 Torr to about 10 Torr, for example, about 0.1 Torr and about 1 Torr, such as about 0.5 Torr and about 0.7 Torr.

One or more inert gases may also be included with the gas mixture provided to the process chamber 200. The inert gas may include, but not limited to, noble gas, such as Ar, He, Xe, and the like. The inert gas may be supplied to the processing chamber at a flow rate of between about 1 sccm and about 50000 sccm.

RF power is applied to maintain the plasma during deposition. The RF power is provided between about 100 kHz and about 100 MHz, such as about 350 kHz or about 13.56 MHz. Alternatively, a VHF power may be utilized to provide a frequency up to between about 27 MHz and about 200 MHz. In one embodiment, the RF power may be supplied between about 1000 Watts and about 10000 Watts. The spacing of the substrate to the showerhead 225 may be controlled in accordance with the substrate dimension. In one embodiment, the processing spacing is controlled between about 100 mils and about 5 inches.

In one embodiment, the dielectric material 408 formed on the substrate 400 is a silicon containing material having nitride or hydrogen atoms, such as $Si_xN_yH_z$ or —Si—N—H— bonds, formed therein, where x is an integer from 1 to 200, y, z are integers from 0 to 400. Since the processing precursor supplied in the gas mixture may provide nitrogen and hydrogen species during depositing, the silicon atoms formed in the dielectric material 408 may contain —Si—N—H—, —Si—N—, or —Si—H— or other different bonding. The Si—N, N—H, Si—H bonds will be further replaced with Si—O—Si bond by the subsequent thermal and wet processes to form the dielectric material 408 as a silicon oxide layer.

At step 306, after the dielectric material 408 is formed on the substrate 400, the substrate 400 is cured and/or thermally processed. The curing process removes moisture and other volatile components from the deposited dielectric material 408 to form a solid phase dielectric material 408, as shown in FIGS. 4C. As the dielectric material 408 is cured, moisture and solvent in the deposited dielectric material 408 outgas, causing the deposited dielectric material 408 to refill and reflow within the trenches 406 defined within the substrate 400, thereby forming a substantially planar surface 410 on the substrate 400. In one embodiment, the curing step 306 may be performed in the batch curing chamber 103.

In some embodiments, the curing temperature may be controlled at a temperature below 150 degrees Celsius, such as below 100 degrees Celsius, for example about 50 degrees Celsius. The curing time may be controlled at between about 1 second and about 10 hours. For example, in one embodiment, a curing process is performed at a temperature at about 90 degrees Celsius for 8 to 10 minutes. In some embodiments, heated purge gases and/or inert carrier gases are used during the curing process, such as argon (Ar) or nitrogen ($N_2$), and are flowed over the substrate, for example via a heated showerhead. In other embodiments, a carrier gas combined with ozone ($O_3$) may be used during the curing process. In either case, the flow of hot process gases over the surface of a substrate on which a flowable dielectric film has been formed, as well as the heating of the substrate, can effectively remove volatile components from the film. In this way, a film formed via a flowable CVD process, such as that deposited in step 304, can be converted to a dense, solid dielectric film with little or no voids, even when formed on a substrate with high aspect ratio features. In some embodiments, the curing process includes a pre-heat step, in which the substrate rests on a heated pedestal for a particular duration of time prior to the flow of process gases (e.g., between about 1 second and about 10 minutes).

At step 310, after the curing process is complete, the dielectric material 408 may be optionally exposed to a thermal annealing process to form an annealed dielectric material 408. Generally the thermal annealing process is performed in a separate processing chamber than the above-described curing process. An example of a suitable thermal anneal chamber in which step 310 may be performed is the CENTURA® RADIANCE® RTP chamber, available from Applied Materials, Inc., among others. It is noted other types of anneal chambers or RTP chambers, including those from other manufacturers, may also be utilized to perform the thermal annealing process as described in step 310.

Batch Cure Processing Sequence Example

Figure 5:
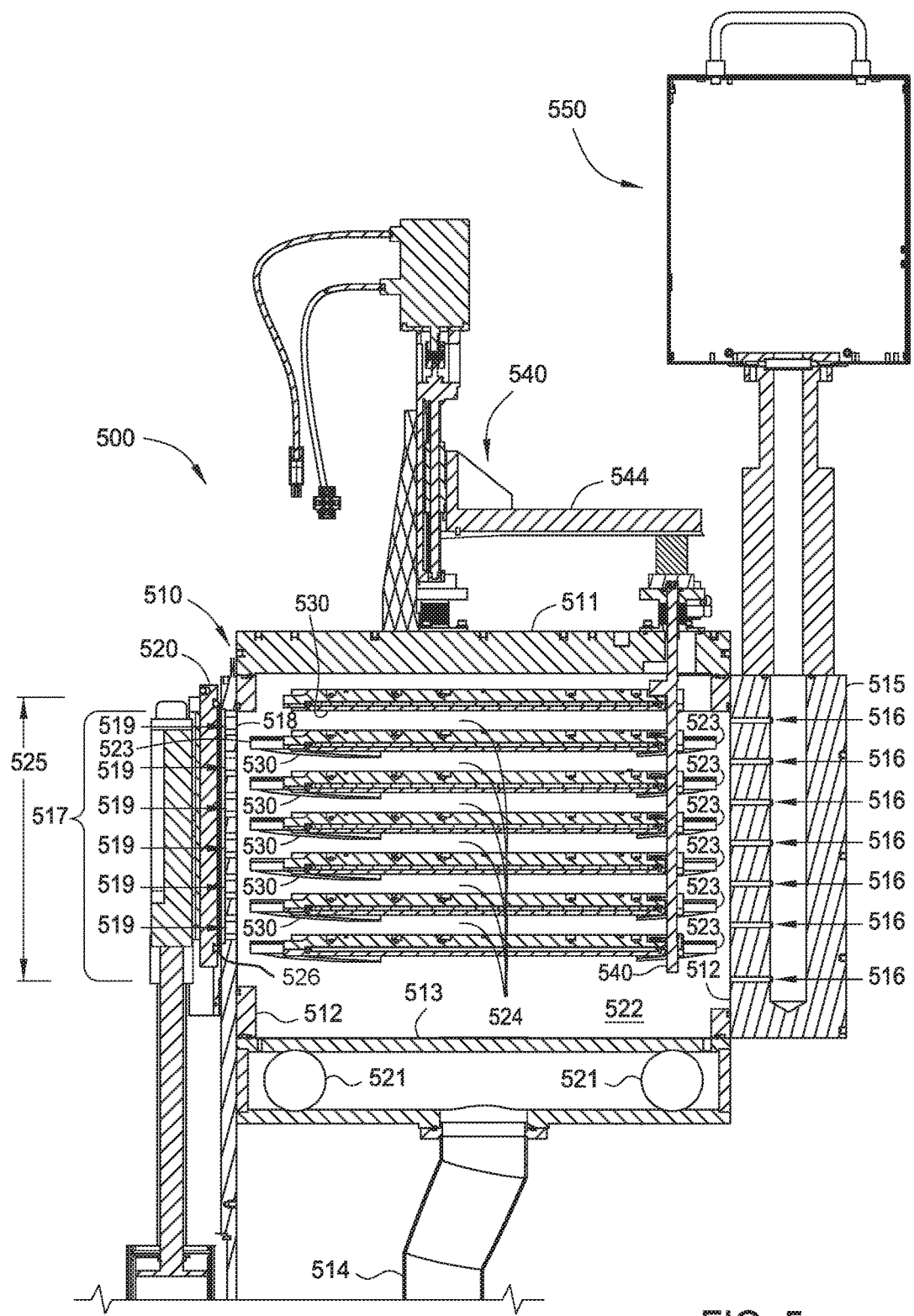
FIG. 5 is a cross-sectional side view of a batch curing chamber configured according to an embodiment of the present disclosure.

FIG. 5 is a side cross-sectional view of a batch curing chamber 500 configured according to an embodiment of the present disclosure. The batch curing chamber 500 may be employed as the batch curing chamber 103 in FIG. 1 and may be used to perform the batch curing process described in step 306 above. The batch curing chamber 500 generally includes a chamber body 510, multiple curing stations 530 disposed inside the chamber body 510, and a multiple substrate lift assembly 540 partially disposed inside the chamber body 510.

The chamber body 510 includes chamber walls 512 coupled to a chamber lid 511 and to a chamber floor 513. A vacuum pump foreline 514, which is configured to pump process and purge gases from the chamber body 510, penetrates the chamber 510 through the chamber floor 513. In other embodiments, the vacuum pump foreline 514 may penetrate the chamber 510 through one or more of the chamber walls 512 and/or the chamber lid 511. The vacuum pump foreline 514 is fluidly coupled, via openings 521 to the processing region 522 of the chamber 510 and to each of the multiple exhaust inlet arrays 523 disposed adjacent to each of the multiple curing stations 530. Thus, process gases, purge gases, and volatile compounds outgassing from substrates during the curing process can be removed from the processing region 522 and from each processing subregion 524 located between the multiple curing stations 530. The multiple exhaust inlet arrays 523 are described in greater detail below in conjunction with FIG. 8.

The chamber body 510 may also include an RPS manifold 515 coupled to one of the chamber walls 512. RPS manifold 515 is configured to direct, via multiple cleaning gas openings 516, cleaning gases into each processing subregion 524 during a periodic cleaning process. Cleaning gases may be generated by a remote plasma source 550. For example, $NH_3$ or any other cleaning gas may pass through a remote plasma source and then be used for removing unwanted deposition build-up on one or more interior surfaces of the chamber body and multiple curing stations 530. Such a process may be performed at specific time intervals, after a predetermined quantity of cured film has been processed by the batch curing chamber 500, or after a predetermined number of substrates have been processed by the batch curing chamber 500.

The chamber body 510 also generally includes a loading opening 517 formed in one of the chamber walls 512, a slotted opening cover 518 (shown in greater detail in FIG. 6) configured with multiple substrate slits 519, and a loading opening door 520 configured to seal loading opening 517 during the curing process. The loading opening door 520 is configured to seal the loading opening 517 with a sealing surface 526 that encompasses the multiple substrate slits 519 (multiple slotted openings) of the slotted opening cover 518. Typically, each of substrate slits 519 corresponds to a respective one of the curing stations 530, and is substantially aligned therewith to allow the atmospheric robot 104 to extend an arm into each of the multiple sub-processing regions 524 when loading opening door 520 is in an open position. The loading opening door 520 is shown in the closed position in FIG. 5.

The loading opening 517 is configured to allow a substrate to be loaded into each of the multiple curing stations 530 without repositioning the loading opening with respect to the multiple curing stations 530 or the factory interface 105. For example, when the multiple curing stations 530 are arranged in a stacked array, as illustrated in FIG. 5, the loading opening 517 is configured to span the stacked array in two dimensions (i.e., height and width), so that all of, or at least a large percentage of, the multiple curing stations 530 in the stacked array are accessible by the atmospheric robot 104. Consequently, when the curing stations 530 are arranged in a vertically stacked array, a height 525 of loading opening 517 is relatively large in order to accommodate the combined height of the multiple curing stations 530. The slotted opening cover 518 may be a plate or other structure configured to minimize or reduce the open area of loading opening 517 when the loading opening 517 is open (e.g., during loading and unloading of substrates). Because loading opening 517 has the relatively large height 525, the free area of loading opening is correspondingly large, which can allow significant quantities of ambient air from factory interface 105 into the batch curing chamber 500 in the absence of slotted opening cover 518. Ambient air entering the batch curing chamber 500 in significant quantities can cause unwanted cooling of the batch curing chamber 500 or oxidation and/or contamination of the internal components in the batch curing chamber 500, and also cause process gases and outgassing products in the batch curing chamber 500 to leak into the factory interface 105. Thus, slotted opening cover 518 helps prevent particles and/or unwanted gases or processing by-products from being transferred to or from the batch curing chamber 500.

Figure 6:
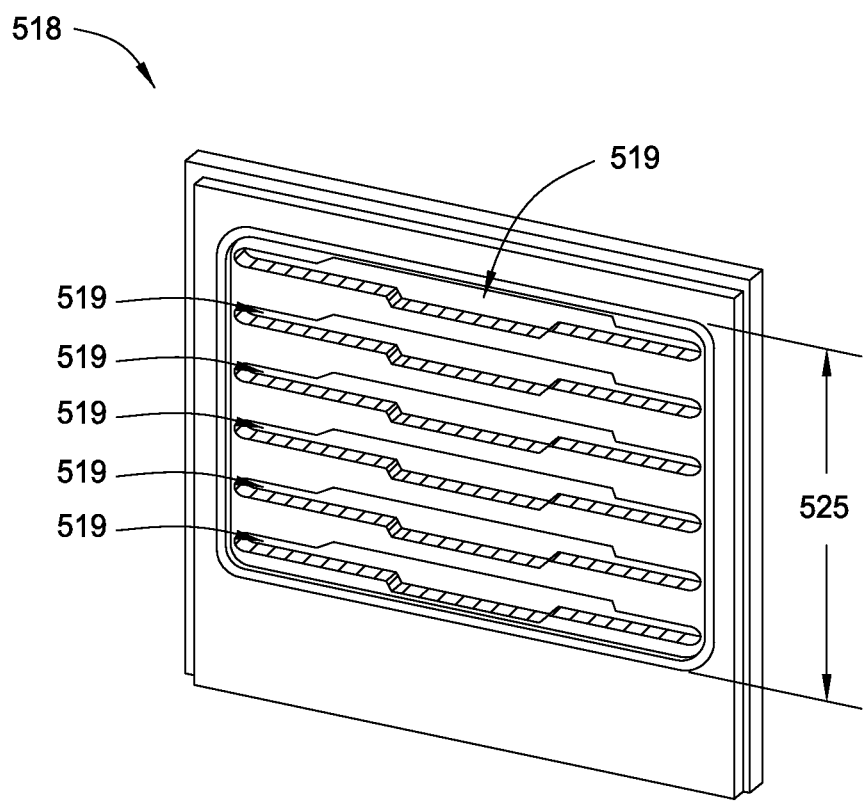
FIG. 6 is an isometric view of a slotted opening cover for the batch curing chamber illustrated in FIG. 5, configured according to an embodiment of the present disclosure.

FIG. 6 is an isometric view of the slotted opening cover 518 for the batch curing chamber 500 illustrated in FIG. 5, configured according to an embodiment of the present disclosure. The slotted opening cover 518 may be a plate or other structure configured to minimize or reduce the open area of loading opening 517 (shown in FIG. 5) when the loading opening 517 is open (e.g., during loading and unloading of substrates). For example, the dimensions of the multiple substrate slits 519 may be selected to be as small as practicable without making interference possible with substrates being loaded and unloaded through the loading opening 517. In such embodiments, the dimensions of the multiple substrate slits 519 may be determined based on tolerance stack-up and chamber-to-chamber variation of the position of the atmospheric robots 104 (shown in FIG. 1), the slotted opening cover 518, the loading opening 517, and any components of the batch curing chamber 500 that may affect the respective positions of the multiple substrate slits 519 relative to the atmospheric robots 104. Thus, in such embodiments, the multiple substrate slits may be configured to conform to a cross-section of a substrate resting on the arm of the atmospheric robot 104, plus additional free area to accommodate tolerance stack-up of components of the batch curing chamber 500, the factory interface 105, the atmospheric robot 104, and the like.

In minimizing the free area of the loading opening 517 while substrates are loaded into the batch curing chamber 500, the slotted opening cover 518 greatly reduces or minimizes entry of ambient air into, and exit of process and purge gases out of, the batch curing chamber 500. Thus, despite the relatively large size of the loading opening 517, little or no process gases and/or volatile compounds escape the batch curing chamber 500 during substrate loading and unloading. Furthermore, unwanted cooling of the batch curing chamber 500, caused by ambient air entering from factory interface 105 or thermal radiation exiting the batch curing chamber 500, is avoided.

Figure 7:
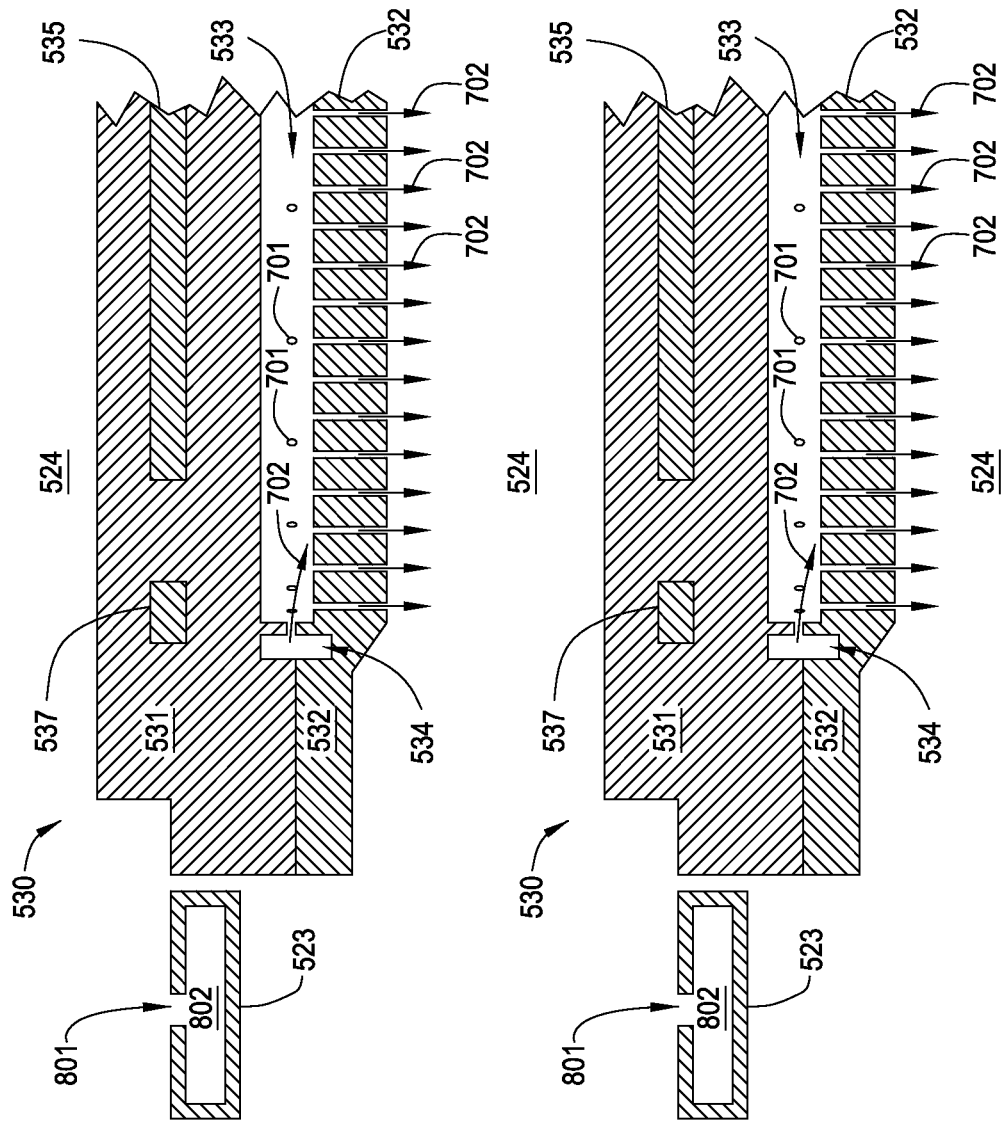
FIG. 7 is a partial cross-sectional view of portions of multiple curing stations, configured according to an embodiment of the present disclosure.

FIG. 7 is a partial cross-sectional view of portions of multiple curing stations 530, configured according to an embodiment of the disclosure. Each of the multiple curing stations 530 disposed inside the chamber body 510 includes a heated substrate pedestal 531, a showerhead 532 positioned above the heated pedestal 531, a showerhead plenum 533 formed between the heated pedestal 531 and the showerhead 532, an annular plenum 534 fluidly coupled to the showerhead plenum 533 and a process gas panel (not shown), a curing station heater 535, and a thermocouple 537. For clarity, the exhaust inlet array 523 that may be disposed adjacent to the curing station 530 is omitted from FIG. 7. A processing subregion 524 is located between each of the multiple curing stations 530.

The heated substrate pedestal 531 is configured to support and, in some embodiments, heat a substrate during a curing process. The showerhead 532 is configured to evenly distribute flow of process gases (i.e., curing gases) and purge gases that enter showerhead plenum 533 into the adjacent processing subregion 524. In addition, the heated substrate pedestal 531 and the showerhead 532 are configured to form the showerhead plenum 533 as shown. It is noted that gases passing through the showerhead plenum 533 and entering a processing subregion 524 may be heated by the heated substrate pedestal 531 associated with a processing subregion 524 that is different from and adjacent to the processing subregion 524 in which the gases are flowed. Alternatively or additionally, gases passing through the showerhead plenum 533 and entering a processing subregion 524 may be heated by the showerhead 532 through which the gases are passing.

In some embodiments, process and/or purge gases passing through the showerhead plenum 533 and entering the processing subregion 524 may first pass through the annular plenum 534 fluidly coupled to the showerhead plenum 533, as shown in FIG. 7. The annular plenum 534 may be configured with a plurality of orifices 701 that are sized to generate more resistance to flow (i.e., pressure drop) on process gases 702 than the resistance to flow generated on the process gases 702 when the process gases 702 flow through the showerhead plenum 533. In this way, even though the annular plenum 534 may be coupled to a process gas panel via a single inlet or a small number of inlets, flow of process gases 702 into the showerhead plenum 533 will be substantially uniform around the circumference of the showerhead 532. Generally, uniform flow of process gases 702 into the showerhead plenum 533 facilitates uniform flow through the showerhead 532 into the processing subregion 524. To further facilitate uniform flow of process gases 702, the orifices 701 may be symmetrically distributed around the inner perimeter of the annular plenum 534.

A maximum free area of orifices 701 that still facilitates uniform flow of process gases 702 into showerhead plenum 533 may be determined based on the number of the orifices 701, the dimensions of the showerhead plenum 533, the resistance to flow generated by the showerhead 532, and an approximate flow rate of process gases 702, among others. Such a maximum free area of orifices 701 may be determined by one of skill in the art given knowledge of the above-described factors.

The batch curing chamber 500 may include the curing station heater 535 and the thermocouple 537, which together enable individual closed-loop temperature control for each of the multiple curing stations 530. Thus, the batch curing chamber 500 can process multiple substrates without the risk of substrate-to-substrate variations caused by temperature variation between the multiple curing stations 530. Without individual temperature control of the curing station heater 535, substrates processed in the top and bottom processing subregions 524 of the batch curing chamber 500 are typically exposed to lower temperatures than substrates processed in the center processing subregions 524, which can significantly affect the curing process wafer-to-wafer batch processing results.

In some embodiments, the thermocouple 537 and the curing station heater 535 are both disposed within the heated substrate pedestal 531, as shown in FIG. 7. In such embodiments, the showerhead 532 and the walls of the annular plenum 534 are heated to a temperature close to that of the heated substrate pedestal 531 via conductive and radiative heat transfer. Consequently, process gases passing through the annular plenum 534, the showerhead plenum 533, and the showerhead 532 are also heated to a temperature approximating that of heated substrate pedestal 531. The thermocouple 537 provides the temperature feedback for closed-loop control of the temperature of the heated substrate pedestal 531 and, therefore, of process gases entering one of the processing subregions 524. Alternatively, the thermocouple 537 may be disposed in contact with the showerhead 532 and/or in contact with process gases that are entering one of the processing subregions 524.

As noted above, the multiple exhaust inlet arrays 523 are disposed adjacent to each of the multiple curing stations 530. In some curing processes performed on a substrate in one of the processing subregions 524, volatile components outgassing from a dielectric film formed on the substrate may form particulates, such as $SiO_2$ particulates. These particulates may come to rest on the substrate being processed, which is highly undesirable. Consequently, the flow pattern of purge and process gases in the batch curing chamber 500 can affect particle contamination on the substrate being in processing subregion 524. Exhaust inlet arrays 523 are configured to draw outgassed volatile components and particulates, if formed, away from the substrate being processed. In some embodiments, two or more exhaust inlet arrays 523 are disposed adjacent to each curing station 530, for example in a symmetrical arrangement, as illustrated in FIGS. 7 and 8A-8C.

Figure 8A:
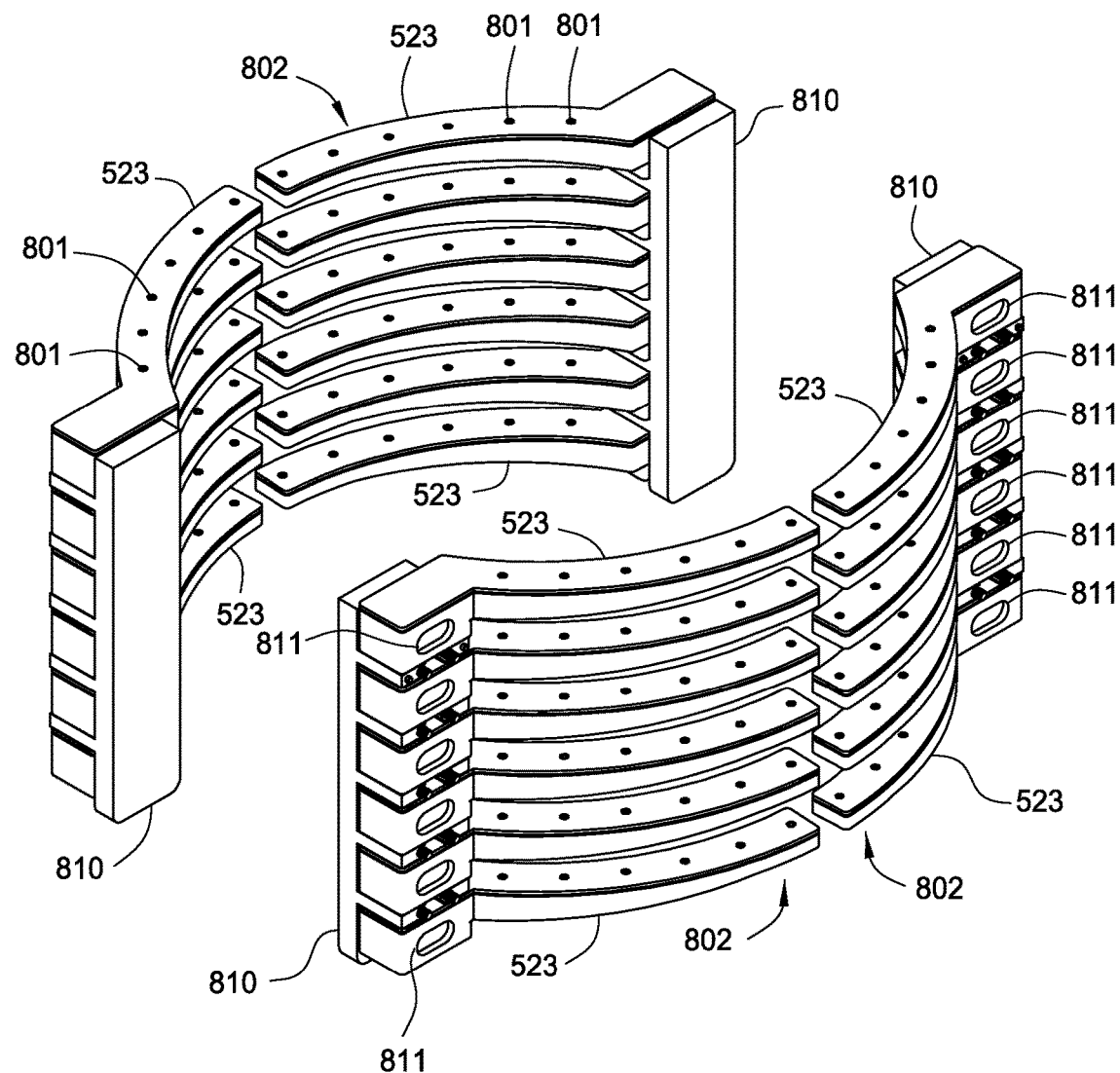
FIG. 8A is an isometric view of multiple groupings of exhaust inlet arrays, arranged according to an embodiment of the present disclosure.
Figure 8B:
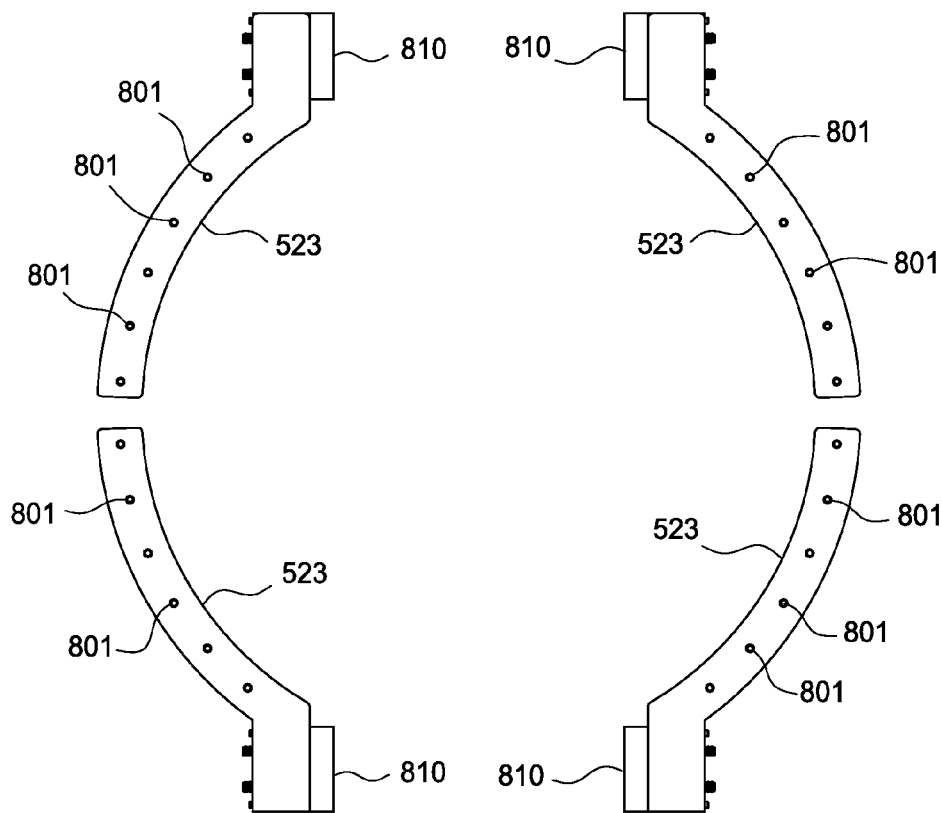
FIG. 8B is a plan view of the multiple groupings of exhaust inlet arrays shown in FIG. 8A.
Figure 8C:
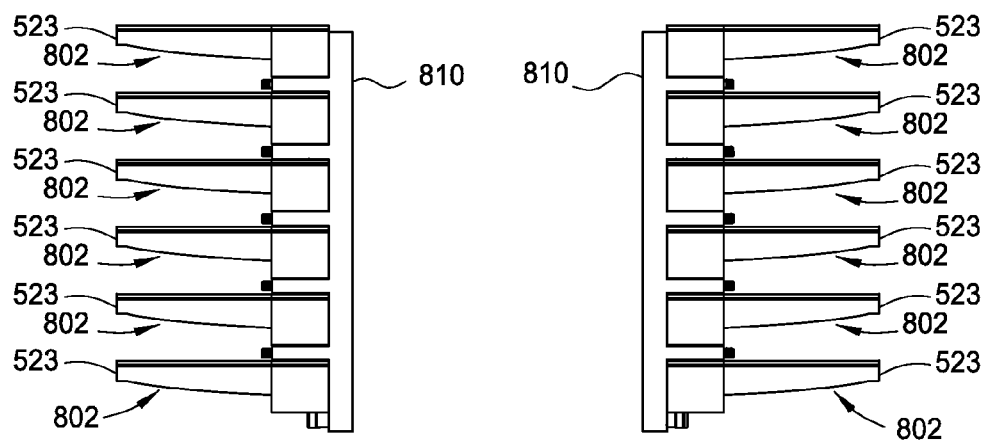
FIG. 8C is a side view of the multiple groupings of exhaust inlet arrays shown in FIG. 8A.

FIG. 8A is an isometric view of multiple groupings of exhaust inlet arrays 523, arranged according to an embodiment of the present disclosure. FIG. 8B is a plan view of the multiple groupings of exhaust inlet arrays 523 shown in FIG. 8A and FIG. 8C is a side view of the multiple groupings of exhaust inlet arrays 523 shown in FIG. 8A. For clarity, most other elements of the batch curing chamber 500 are omitted. As shown, in the embodiment illustrated in FIGS. 8A-8C, a grouping of four exhaust inlet arrays 523 is positioned to be adjacent to a particular curing station 530, for a total of six groupings of four exhaust inlet arrays 523. In other embodiments, a grouping of more or fewer than four of the exhaust inlet arrays 523 may be positioned adjacent to a single curing station 530.

Each exhaust inlet array 523 includes a plurality of exhaust inlets 801 that are fluidly coupled to an exhaust plenum 802, which is located inside the exhaust inlet array 523. In some embodiments, each exhaust inlet array 523 is mechanically coupled to a support member 810 that structurally supports and positions the exhaust inlet array 523 coupled thereto. In the embodiment illustrated in FIGS. 8A-C, the batch curing chamber 500 includes four separate support members 810, whereas in other embodiments, the batch curing chamber 500 may be configured with more or fewer than four total support members 810. In addition, each exhaust inlet array 523 is fluidly coupled to an exhaust manifold (not shown for clarity), which is in turn fluidly coupled to the foreline 514 of batch curing chamber 500 (shown in FIG. 5). In some embodiments, one or more of the support members 810 may also be configured as an exhaust manifold.

In some embodiments, some or all of the exhaust inlet arrays 523 may include a flow-balancing orifice 811. In such embodiments, each flow-balancing orifice 811 is configured to restrict flow to the associated exhaust inlet array 523 so that flow of process gases and outgassing components through each exhaust inlet array 523 is equalized or substantially equalized relative to adjacent exhaust inlet arrays 523. In some embodiments, the flow-balancing orifices 811 are fixed orifices. In such embodiments, the particular size of each fixed orifice may be determined using computer simulations, flow visualization, trial-and-error methods, or any combination thereof. In other embodiments, some or all of the flow-balancing orifices 811 are adjustable orifices (such as needle valves), which can be set at the time of manufacture, in the field, and/or in response to exhaust balance issues in the batch curing chamber 500.

The multiple substrate lift assembly 540 is configured to remove individual substrates from and place individual substrates on the atmospheric robot 104 during loading and unloading. In addition, the multiple substrate lift assembly 540 is configured to position multiple substrates simultaneously during processing in the batch curing chamber 500. For example, in some embodiments, the multiple substrate lift assembly 540 is configured to simultaneously position each substrate being processed into a processing position and into a pre-heat position. Generally, a substrate is positioned proximate the showerhead 532 when in the processing position and is positioned on the heated substrate pedestal 531 when in the pre-heat position.

Figure 9:
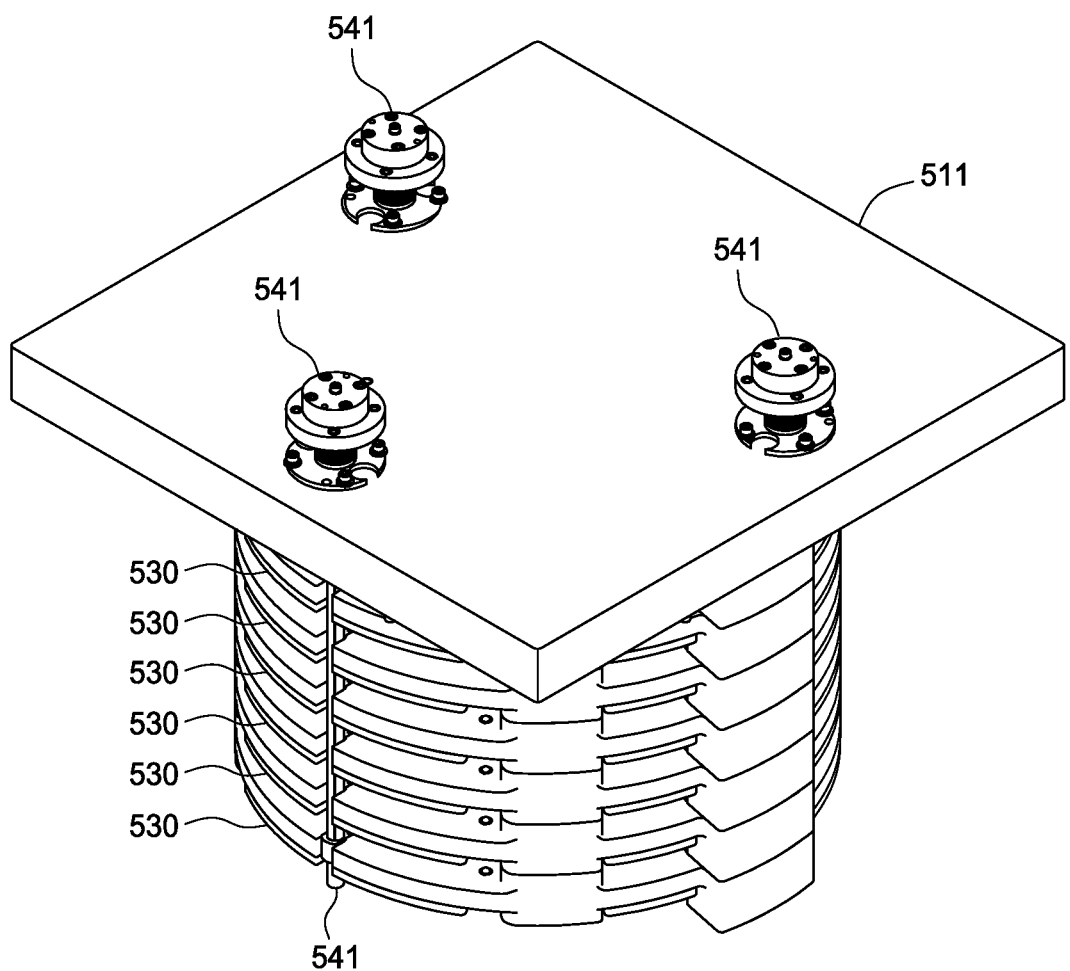
FIG. 9 is an isometric view of a chamber lid and portions of lift pin indexers of the multiple substrate lift assembly illustrated in FIG. 5.

The multiple substrate lift assembly 540 includes multiple lift pin indexers 541, for example three or more. In the embodiment illustrated in FIG. 5, the multiple substrate lift assembly 540 includes three lift pin indexers 541, but only one is visible. FIG. 9 is an isometric view of the chamber lid 511 and portions of all three lift pin indexers 541 of the multiple substrate lift assembly 540. For clarity, the chamber walls 512 and the chamber floor 513 are omitted from FIG. 9. Each of the three lift pin indexers 541 are partially disposed inside the chamber body 510 and are coupled to a lift mechanism 544 (shown in FIG. 5 and omitted from FIG. 9 for clarity). The lift mechanism 544 may be any mechanical actuator suitable for positioning substrates in a load, an unload, a pre-heat, and a processing position, as described above. For example, the lift mechanism may include a pneumatic actuator, a stepper motor, and the like.

Figure 10:
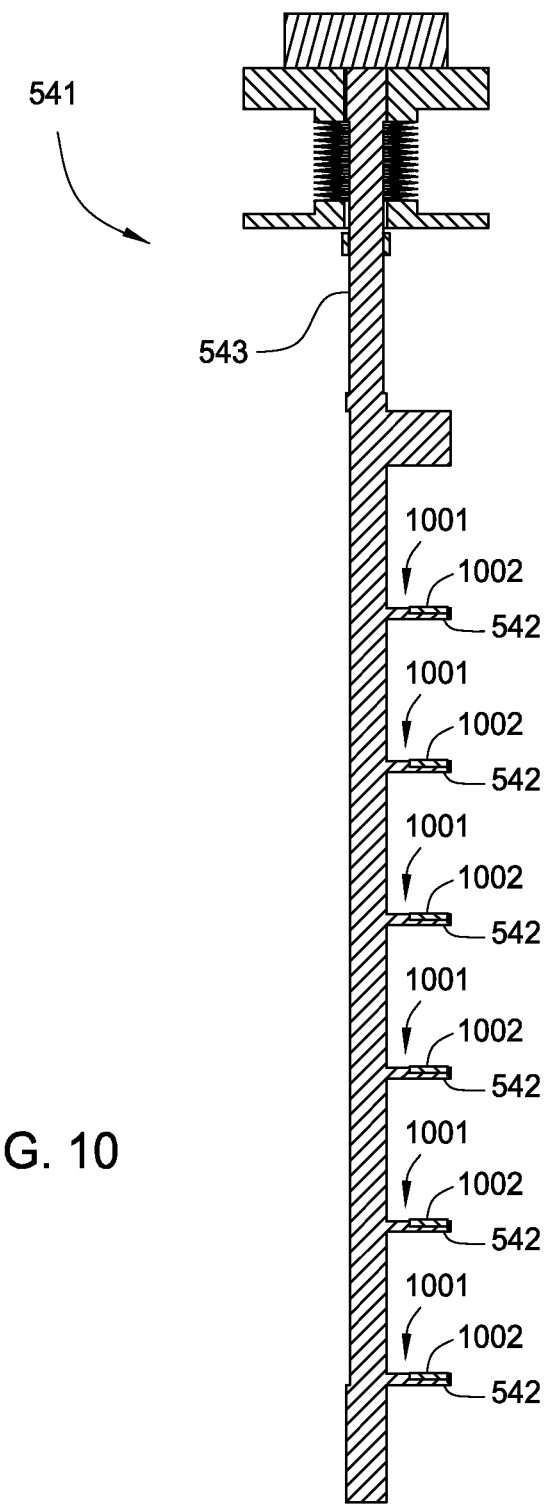
FIG. 10 is a cross-sectional view of a lift pin indexer, configured according to an embodiment of the present disclosure.

FIG. 10 is a cross-sectional view of a lift pin indexer 541, configured according to an embodiment of the present disclosure. As shown, the lift pin indexer 541 generally includes one lift pin 542 for each of the processing subregions 524 in the batch curing chamber 500. Thus, in the example illustrated in FIGS. 5, 9, and 10, each lift pin indexer 541 includes six lift pins 542 coupled to a vertical shaft 543. The three lift pin indexers 541 can simultaneously position six substrates in the processing position or simultaneously set the six substrates onto a respective heated substrate pedestal 531 in the pre-heat position.

In some embodiments, each lift pin 542 is configured with a low-contact, thermally isolating contact surface 1001 to reduce and/or minimize heat transfer during processing from a substrate to the lift pins 542. In this way so-called "cold spots" on the substrate are reduced or eliminated during processing, thereby improving uniformity of the dielectric film that is being cured in the batch curing chamber 500. In some embodiments, the contact surface 1001 is formed with a cylindrical element 1002, so that the area of contact between a substrate and the contact surface 1001 is reduced to line or point contact. In addition, the cylindrical element 1002 may be formed from a material that has a lower coefficient of thermal conductivity than materials typically used to form the lift pins 542, such as aluminum and stainless steel. For example, in some embodiments, the cylindrical element 1002 may be formed from sapphire ($Al_2O_3$).

In sum, one or more embodiments of the present disclosure provide systems and methods for curing a dielectric material disposed on multiple substrates without the substrate-to-substrate variation generally associated with batch processing. Specifically, a batch curing chamber includes multiple processing sub-regions that are each independently temperature controlled. In addition, a slotted cover mounted on the loading opening of the chamber greatly reduces the effect of ambient air entering the chamber during loading and unloading.

While the foregoing is directed to embodiments of the present disclosure, other and further embodiments of the disclosure may be devised without departing from the basic scope thereof, and the scope thereof is determined by the claims that follow.

What is claimed is:

1. A batch substrate processing chamber, comprising:
   multiple sub-processing regions that are each configured to receive a substrate from an atmospheric robot and to perform a curing process on the substrate received from the atmospheric robot;
   a loading opening formed in a wall of the batch processing chamber;
   a first door disposed over the loading opening; and
   a cover plate disposed over the loading opening comprising multiple slotted openings, wherein
      the first door is disposed over all of the multiple slotted openings,
      the first door is configured to seal the loading opening with a sealing surface that encompasses the multiple slotted openings,
      each of the slotted openings are configured to allow at least one atmospheric robot to extend an arm from a position outside of the batch processing chamber to one of the multiple sub-processing regions, and
      each of the multiple slotted openings are configured to reduce the free area of the loading opening when the loading opening is open.

2. The batch processing chamber of claim 1, wherein
   each of the multiple slotted openings corresponds to one of the multiple sub-processing regions, and
   each of the multiple slotted openings has a shape that is asymmetric relative to a shape of the door and a shape of the loading opening.

3. The batch processing chamber of claim 2, wherein
   each of the multiple slotted openings is substantially aligned with the corresponding one of the multiple sub-processing regions, and
   each of the multiple slotted openings includes a shape having more edges than a shape of the door and a shape of the loading opening.

4. The batch processing chamber of claim 1, wherein the loading opening is configured to allow a substrate to be loaded into each of the multiple curing stations without repositioning the loading opening with respect to the multiple curing stations.

5. The batch processing chamber of claim 1, wherein the multiple sub-processing regions are arranged in a stacked array.

6. The batch processing chamber of claim 5, wherein the loading opening is configured to span the stacked array in two dimensions.

7. The batch processing chamber of claim 1, wherein each of the multiple sub-processing regions in the batch processing chamber is disposed between a heated substrate pedestal and a showerhead.

8. The batch processing chamber of claim 7, wherein the showerhead is configured to independently deliver a process gas to an adjacent sub-processing region.

9. The batch processing chamber of claim 7, wherein the heated substrate pedestal is configured to independently control a temperature of a substrate disposed thereon.

10. A system for forming a dielectric material on a surface of a substrate, the system comprising:
    a mainframe;
    a factory interface that includes at least one atmospheric robot and is configured to receive one or more cassettes of substrates;
    a load lock chamber that is coupled to the mainframe and is configured to receive one or more substrates from the at least one atmospheric robot in the factory interface;
    multiple flowable CVD chambers that are each coupled to the mainframe; and
    a batch processing chamber coupled to the factory interface, the batch processing chamber comprising:
       multiple sub-processing regions that are each configured to receive a substrate from the at least one atmospheric robot and to perform a curing process on the substrate received from the atmospheric robot;
       a loading opening formed in a wall of the batch processing chamber;
       a first door disposed over the loading opening; and
       a cover plate that includes multiple slotted openings and is disposed over the loading opening, wherein
          the first door is disposed over all of the multiple slotted openings,
          the first door is configured to seal the loading opening with a sealing surface that encompasses the multiple slotted openings,
          each of the multiple slotted openings are configured to allow the at least one atmospheric robot to extend an arm from a position outside of the batch processing chamber to one of the multiple sub-processing regions, and
          each of the multiple slotted openings are configured to reduce the free area of the loading opening when the loading opening is open.

11. The system of claim 10, wherein
    each of the multiple slotted openings corresponds to one of the multiple sub-processing regions, and
    each of the multiple slotted openings has a shape that is asymmetric relative to a shape of the door and a shape of the loading opening.

12. The system of claim 11, wherein
    each of the multiple slotted openings is substantially aligned with the corresponding one of the multiple sub-processing regions, and
    each of the multiple slotted openings includes a shape having more edges than a shape of the door and a shape of the loading opening.

13. The system of claim 10, wherein the loading opening is configured to allow a substrate to be loaded into each of the multiple curing stations without repositioning the loading opening with respect to the multiple curing stations or the factory interface.

14. The system of claim 10, wherein the multiple flowable CVD chambers are each configured to deposit a flowable dielectric layer on a substrate via a CVD process.

15. The system of claim 10, wherein the multiple sub-processing regions are arranged in a stacked array and the loading opening is configured to span the stacked array in two dimensions.

16. The system of claim 10, wherein the factory interface further includes at least one atmospheric holding station configured to temporarily store substrates outside the batch processing chamber prior to being processed in the batch processing chamber.

17. The system of claim 10, wherein a total number of the multiple sub-processing regions in the batch processing chamber is equal to a total number of the multiple flowable CVD chambers that are coupled to the mainframe.

18. The system of claim 10, wherein each of the multiple sub-processing regions in the batch processing chamber is disposed between a heated substrate pedestal and a showerhead.

19. The system of claim 18, wherein the showerhead is configured to independently deliver a process gas to a substrate disposed in the sub-processing region.

20. The system of claim 18, wherein the heated substrate pedestal is configured to independently heat a substrate disposed in the sub-processing region during processing.

* * * * *